United States Patent [19]
Ta

[11] Patent Number: 5,383,155
[45] Date of Patent: Jan. 17, 1995

[54] DATA OUTPUT LATCH CONTROL CIRCUIT AND PROCESS FOR SEMICONDUCTOR MEMORY SYSTEM

[75] Inventor: Trang K. Ta, Austin, Tex.

[73] Assignee: International Business Machines Corporation, Armonk, N.Y.

[21] Appl. No.: 148,601

[22] Filed: Nov. 8, 1993

[51] Int. Cl.$^6$ ............................................. G11C 7/00
[52] U.S. Cl. .............................. 365/191; 365/189.05; 365/233.5; 365/230.08; 365/210; 327/291; 326/93
[58] Field of Search ...................... 365/233, 233.5, 191, 365/194, 189.01, 189.05, 230.08, 210; 307/451, 260, 269

[56] References Cited

U.S. PATENT DOCUMENTS

| | | | |
|---|---|---|---|
| 4,592,027 | 5/1986 | Masaki | 365/203 |
| 4,864,574 | 9/1989 | Pritt | 307/269 X |
| 4,928,265 | 5/1990 | Higuchi et al. | 365/189.01 |
| 4,953,130 | 8/1990 | Houston | 365/194 X |
| 4,954,992 | 9/1990 | Kumanoya et al. | 365/207 |
| 4,975,877 | 12/1990 | Bell | 365/189.01 |
| 5,027,325 | 6/1991 | Katsura | 365/205 |
| 5,031,150 | 7/1991 | Ohsawa | 365/193 |
| 5,077,690 | 12/1991 | Smith | 365/230.8 X |

OTHER PUBLICATIONS

Ouellette et al., "BiCMOS SRAM with Array-Integrated Sense Devices," IBM Burlington Technical Disclosure, pp. 1–3, May 1991.

Ta et al., "A 10-ns Embedded Growable Array," IBM Burlington Technical Disclosure, pp. 1–3, Jan. 1992.

Primary Examiner—Eugene R. LaRoche
Assistant Examiner—Son Mai
Attorney, Agent, or Firm—Heslin & Rothenberg

[57] ABSTRACT

Control circuit and control processing for a memory system having a system data bus coupled to at least one data output latch. The control circuit and process generate a read command (RC) to enable the at least one data output latch to latch data from the system data bus in response to a read clock signal (RCLK). The read command (RC) occurs substantially simultaneous with the instant that a valid data state exists on the system data bus and is developed without directly monitoring the system data bus. Upon detecting the read clock signal (RCLK) a latch enable signal is generated. A valid data signal is next generated independent of the system data bus through the use of a dummy circuit having multiple dummy cells, dummy bitlines and a common dummy bus. The valid data signal can be generated either simultaneous with the instant of valid data development on the system data bus or can precede the instant of valid data development by a predetermined small interval of time predefined through the system architecture. The read command (RC) is generated upon occurrence of both the latch enable signal and the valid data signal.

26 Claims, 4 Drawing Sheets

DATA OUTPUT LATCH CONTROL CIRCUIT AND PROCESS FOR SEMICONDUCTOR MEMORY SYSTEM

TECHNICAL FIELD

The present invention relates generally to semiconductor memory systems, and more particularly, to a control circuit and control process for a read access wherein a read command is timed to enable data output latches substantially simultaneous with development of valid data on the memory system data bus.

BACKGROUND ART

Today's semiconductor memory systems employ multiple subarrays of memory storage units closely packed together. Each subarray is segmented into multiple rows or words, with each word containing multiple data storage cells. Each data storage cell accommodates a bit of data. Typically these multiple subarrays of memory storage units are coupled together by numerous common interconnections, including a common system data bus. During a read access, a system control circuit oversees selection of a particular data storage cell and transfer of that cell's data to the common system data bus for output from the memory system. Upon receipt of a read command (RC) from the control circuit, data to be output is latched from the system data bus into associated multiple data output latches.

The read command (RC) is generated by the control circuit in response to an externally-generated read clock signal. Without added delay, the read command (RC) is generated long before data on the system data bus becomes valid. Since the system data bus is common to all subarrays, it has significant associated capacitance which in the case of a low state signal must be dissipated before the data signal can become valid. In such a case, the cross-coupled connections of the data output latches are unnecessarily exposed to the stored charge on the system data bus (rather than a valid low state signal) and possibly unnecessarily switched to the wrong data value. When valid data does appear on the system data bus (which in this example is assumed to be a low state), a wrongly switched latch would again have to change state. Such double switching undesirably increases noise and power dissipation within the memory system. Traditionally, the problem has been addressed by buffering the read command (RC) through a fixed delay which the circuit designer determines is sufficient to ensure that valid data has developed on the system data bus. Clearly, the fixed delay solution can unnecessarily lengthen the read access cycle.

Thus, a need exists within the semiconductor memory technology for a control circuit and control process which generate a read command (RC) substantially simultaneous with development of valid data on the system data bus in response to positive information indicative of the instant of valid data development.

DISCLOSURE OF INVENTION

Briefly summarized, the invention comprises in one aspect a control circuit for a memory system having a common system data bus coupled to at least one data output latch. The control circuit generates a read command to enable the at least one data output latch to latch data from the system data bus in response to a read clock signal. The control circuit includes detecting means for detecting the read clock signal and for generating in response thereto a latch enable signal. Signaling means independent of the system data bus provides a valid data signal representative of valid data occurring on the system data bus. The valid data signal is generated by the signaling means without direct monitoring of the system data bus. A control means is coupled to the detecting means and the signaling means for providing the read command to the at least one data output latch upon occurrence of both the latch enable signal and the valid data signal.

In another aspect, the invention comprises a control circuit for a memory system having multiple memory subarrays and a common system data bus coupled to at least one data output latch. The control circuit generates a read command to enable the at least one data output latch to latch valid data from the system data bus in response to a read clock signal. The control circuit includes a detecting means for detecting the read clock signal and for generating in response thereto a latch enable signal. A dummy circuit is associated with each memory subarray for generating in response to the read clock signal, independent of the system data bus, a valid data signal representative of valid data occurring on the system data bus. Control means is coupled to the detecting means and to the dummy circuit for providing the read command to the at least one data output latch upon occurrence of both the latch enable signal and the valid data signal.

In yet another aspect, the present invention comprises a method for generating a read command within a memory system having a common system data bus coupled to at least one data output latch. The read command enables the at least one data output latch to latch valid data from the system data bus in response to a read clock signal. The method includes the steps of: detecting the read clock signal and generating in response thereto a latch enable signal; generating without monitoring the system data bus a valid data signal representative of valid data occurring on the system data bus; and providing the read command to the at least one data output latch upon occurrence of both the latch enable signal and the valid data signal.

To summarize, this invention comprises a novel control circuit and process approach for overseeing a read access cycle within a semiconductor memory system. The approach is to precisely generate a read command substantially simultaneous with development of valid data on the system data bus. By providing a positive indication of valid data development on the system data bus the read access cycle can be shortened, thereby improving system performance. The concepts presented apply to any memory system including RAMs, ROMs, DRAMs, SRAMs, etc. Reduced system noise and power losses result from ensuring elimination of double switching at the data output latches. The control circuit and control process are independent of the system data bus, requiring no direct monitoring of the common bus.

BRIEF DESCRIPTION OF DRAWINGS

These and other objects, advantages and features of the present invention will be more readily understood from the following detailed description of certain preferred embodiments of the present invention, when considered in conjunction with the accompanying drawings in which.

BEST MODE FOR CARRYING OUT THE INVENTION

Reference is now made to the drawings in which the same reference numbers are used throughout the different figures to designate the same or similar components.

Figure 1:
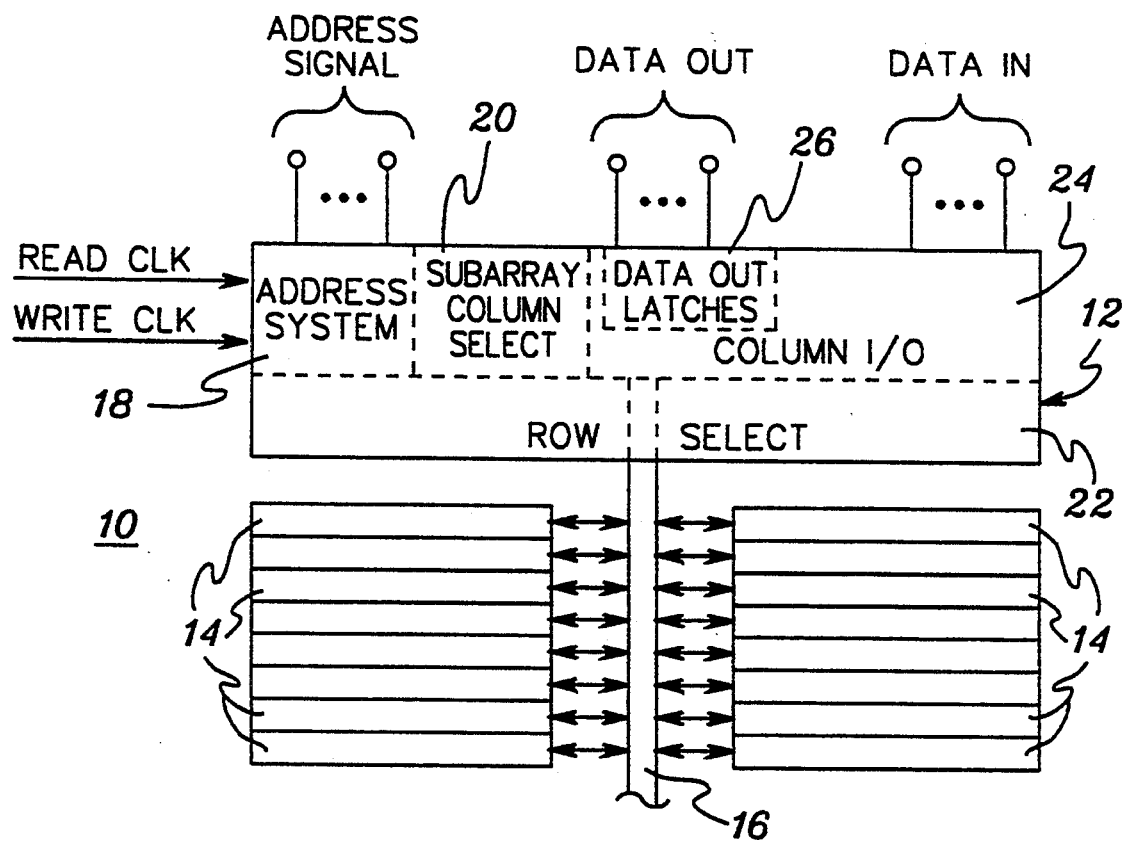
FIG. 1 is a block diagram of one embodiment of a semiconductor memory system to employ a control circuit and control processing in accordance with the present invention.

One embodiment of a semiconductor memory system, generally denoted 10, is depicted in FIG. 1. System 10, which is to incorporate a control circuit and control processing in accordance with the present invention, includes a control circuit 12 coupled to multiple memory subarrays 14 each of which receives and transfers data through a common system data bus 16. Addressing and control circuit 12 includes an addressing system 18, a subarray column select 20, a row select 22 and a column I/O 24. These circuits are each well known to those skilled in the art and are well documented in the available literature.

Inputs to circuit 12 include an "Address Signal", a "Data In" signal (during a write cycle), and "read clock" and "write clock" signals which initiate read cycles and write cycles, respectively. Output from circuit 12 is a parallel "Data Out" signal, provided via a plurality of data output latches 26. Each valid data bit is transferred from the system data bus to a corresponding data output latch of latches 26. As an example, if system data bus 16 comprises 36 bits, then control circuit 12 includes 36 data output latches 26. These latches are typically disposed within column I/O block 24 of control circuit 12.

Figure 2:
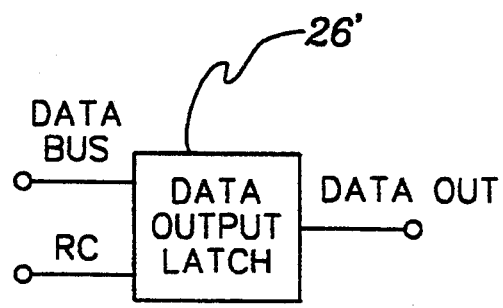
FIG. 2 is a block diagram of a data output latch employed by the semiconductor memory system of FIG. 1.

During a read cycle, each data output latch 26' (FIG. 2) is clocked by a read command (RC) produced by control circuit 12 of memory system 10 in response to the read clock signal (RCLK). Once enabled, each data output latch 26' (FIG. 2) sets based upon the present data value of the corresponding bit of system data bus 16. As noted, the "Data Out" signal from control circuit 12 is taken in parallel from the multiple data output latches 26.

Figure 3:
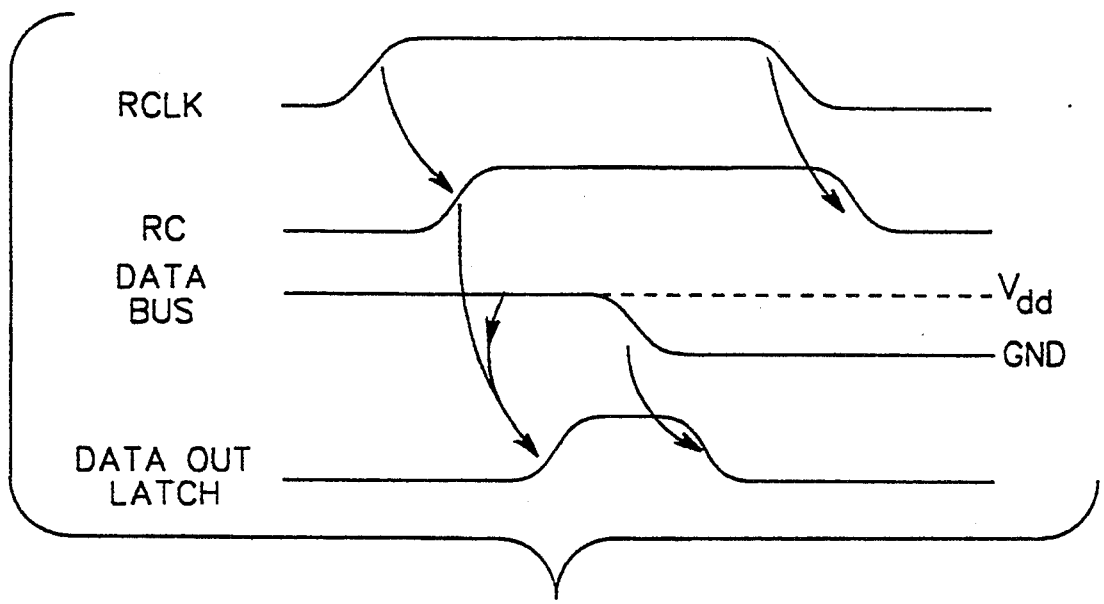
FIG. 3 is a timing diagram of conventional read access signals for a semiconductor memory system.

The timing diagram of FIG. 3 illustrates the problem inherent in a conventional read access. Upon receipt of a read clock signal (RCLK) the control circuit generates a read command (RC), which is identical to but delayed slightly from the read clock signal (RCLK). The delay results from circuit buffering and capacitance. The read command (RC) is the enabling signal which clocks the data output latches coupled to the system data bus. Traditionally, a precharge cycle precedes each read access during which the system data bus is precharged to a high state ($V_{dd}$). If for a given bit a valid data signal has a low state (GND), then early enablement of the corresponding data output latch (before valid data has developed on the system data bus) will result in the latch improperly setting to a high state. After valid data has developed on the data bus, this latch must again switch only this time to the developed low state.

In such a case, the data output latch has undergone a double switching, which unnecessarily increases noise and power dissipation within the semiconductor memory system. Note that the problem exists in this example only when the valid data value is other than the precharge value applied to the system data bus during the precharge cycle. The existing solution to the problem has been to delay the enabling read command (RC) until a time that the system designer can guarantee valid data exists on the system data bus. However, such a fixed delay approach can negatively impact system performance.

Figure 4:
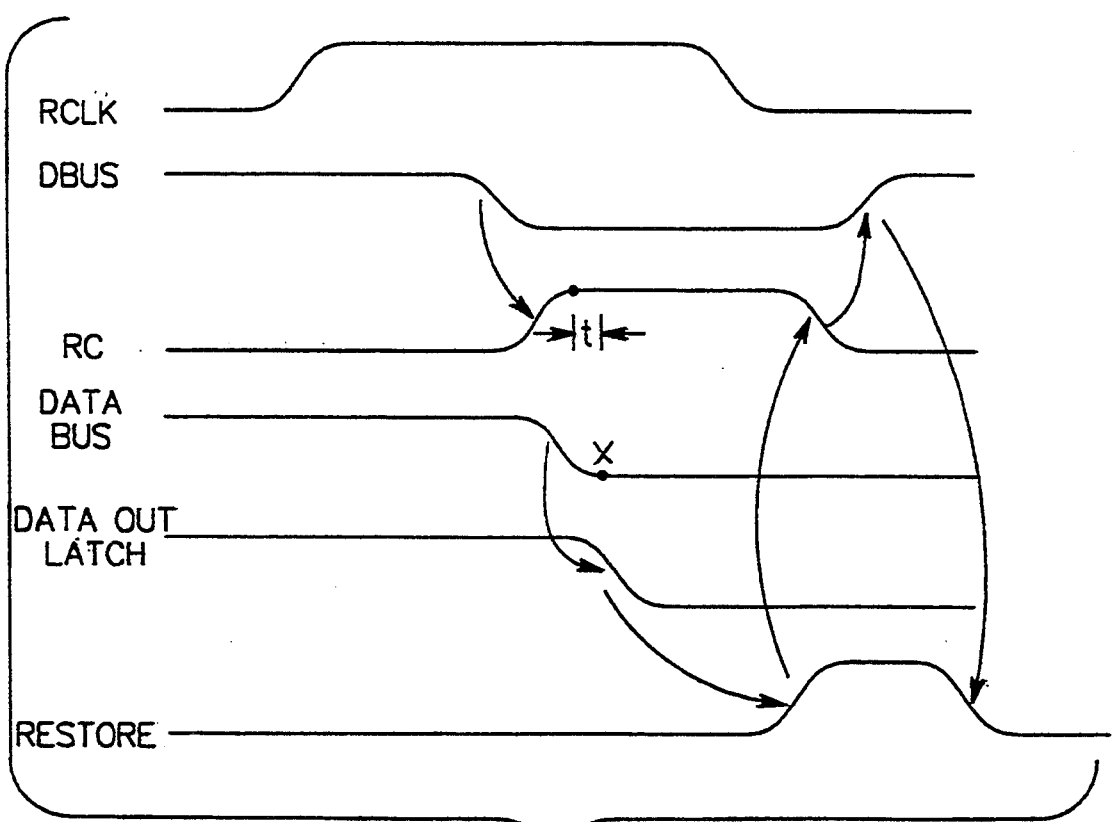
FIG. 4 is a timing diagram of read access signals pursuant to the present invention for a semiconductor memory system.

In general, a control circuit (and control process) in accordance with the present invention precisely controls the generation of the read command (RC) in response to positive information so that the read command (RC) occurs simultaneous with or, if preferred, at a time interval slightly prior to, the instant that valid data develops on the system data bus. FIG. 4 comprises one timing diagram example for such a control circuit and process.

As shown, the read command (RC) no longer automatically follows the read clock (RCLK) by a small delay but rather (pursuant to the invention) is tied to the instant at which valid data develops on the system data bus. In the timing case depicted, the read command (RC) is generated at a small predefined time interval 't' prior to the instant 'x' valid data develops on the system data bus. (Attainment of offset 't' is discussed below.) Thus, assuming that the data output latch must switch, only a single switching of the latch occurs. In the timing diagram depicted an assumption is made that the previous read access for the subject data output latch read a high state, while the newly developed data value of the corresponding bit of the system data bus has a low state (see DATA OUT LATCH). A conventional "RESTORE" signal is employed to return the read command (RC) to a non-enabling state prior to initiation of a next data bus precharge cycle. The arrows of FIG. 4 highlight the cause and effect of control processing in accordance with the present invention. Note in particular that the signal on DBUS controls initiation of the read command (RC).

Essentially, the present control process includes detecting the read clock signal (RCLK) and generating in response thereto a latch enable signal; providing positive information on when a valid data signal occurs on the system data bus and generating the read command (RC) for the data output latches only upon occurrence of both the latch enable signal and the valid data signal. Note that the valid data signal is efficiently generated independent of the system data bus, i.e., there is no direct monitoring of the system data bus to determine when valid data occurs.

Figure 5:
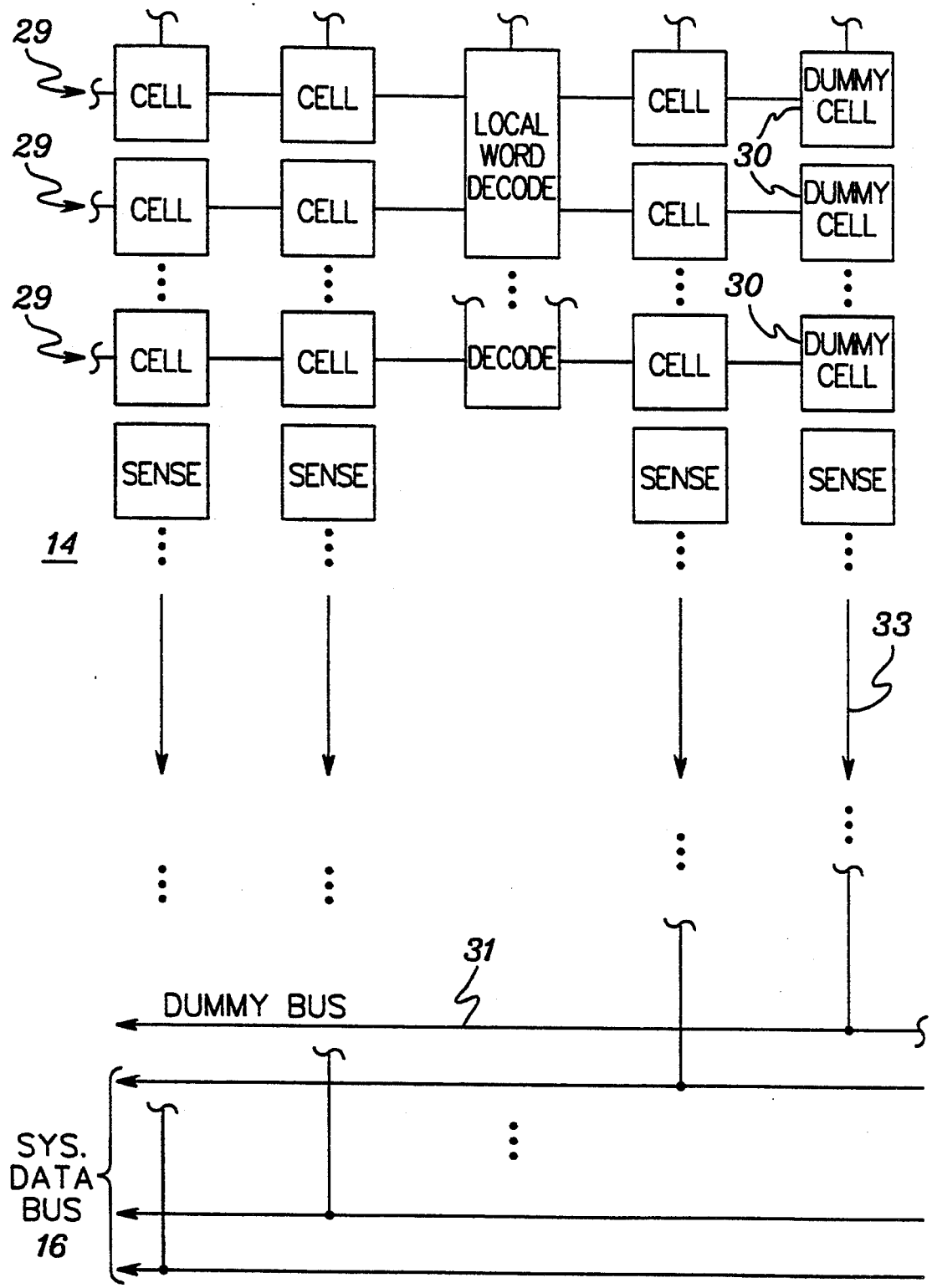
FIG. 5 is a partial block diagram of a memory subarray, a system data bus and a dummy circuit of a semiconductor memory system in accordance with the present invention.

In one preferred implementation, a dummy circuit including a dummy bus (DBUS) is provided to develop a data valid signal that switches state simultaneous with development of valid data on the system data bus, or at a precise, predefined time interval prior to development of valid data on the system data bus. FIG. 5 partially depicts one embodiment of a memory subarray employing this concept. Each word 29 of subarray 14 includes a dummy cell 30 which, for example, is constructed to transfer (over a dummy bitline 33) a low state to a dummy bus 31 whenever the corresponding word is read. The dummy circuit includes dummy cells 30, dummy bitlines 33 and the common dummy bus 31. Note that reading of a word within one of the subarrays of the memory system triggers the dummy circuit (through the corresponding dummy cell) to generate the valid data signal.

Simultaneous switching can be attained by appropriately sizing the dummy bus and connecting the bus to receive the same capacitive loading as the system data bus. For example, the dummy data bus is driven by the same number of read heads as that driving the system data bus. As an alternative to simultaneous switching of the dummy bus with development of valid data on the system data bus, dummy bus switching can precede the instant of valid data development on the system data bus by a predefined time interval. Early triggering of the dummy bus can be attained by reducing loading on dummy bus 31, or reducing loading on dummy bitline 33. This is necessarily a trial and error exercise to be performed by the system designer. The goal is to have the valid data signal (i.e., switching signal DBUS) of the dummy data bus precede the instant of valid data signal development on the system data bus by a small, desired interval of time 't' to ensure that the latches are enabled at the instant of valid data development. The same result could also be obtained by one of ordinary skill in the art by modifying the size of the dummy cells associated with the words of the subarrays relative to the size of the storage cells.

The dummy bus 31 undergoes the same precharge cycle as system data bus 16 so that dummy bus 31 begins every read cycle with a high state and switches to a low state with the low signal output from the corresponding dummy cell 30 of the read word within a subarray. One skilled in the art can readily fabricate the dummy cells 30 to consistently output a low state signal whenever the associated word is read; for example, by tying each dummy cell's cross-couple node to ground. Again, in this embodiment, a low state signal on dummy bus 31 comprises the "data valid signal." Note that this signal coincides with and "represents" development of valid data on the system data bus since the dummy circuit components have the same sizings and experience the same loadings as the system's storage cells, bitlines, and common data bus. Further, the signal is arrived at independent of any direct monitoring of the system data bus. The data valid signal is employed by a control circuit in accordance with the present invention to generate the read command (RC).

Figure 6:
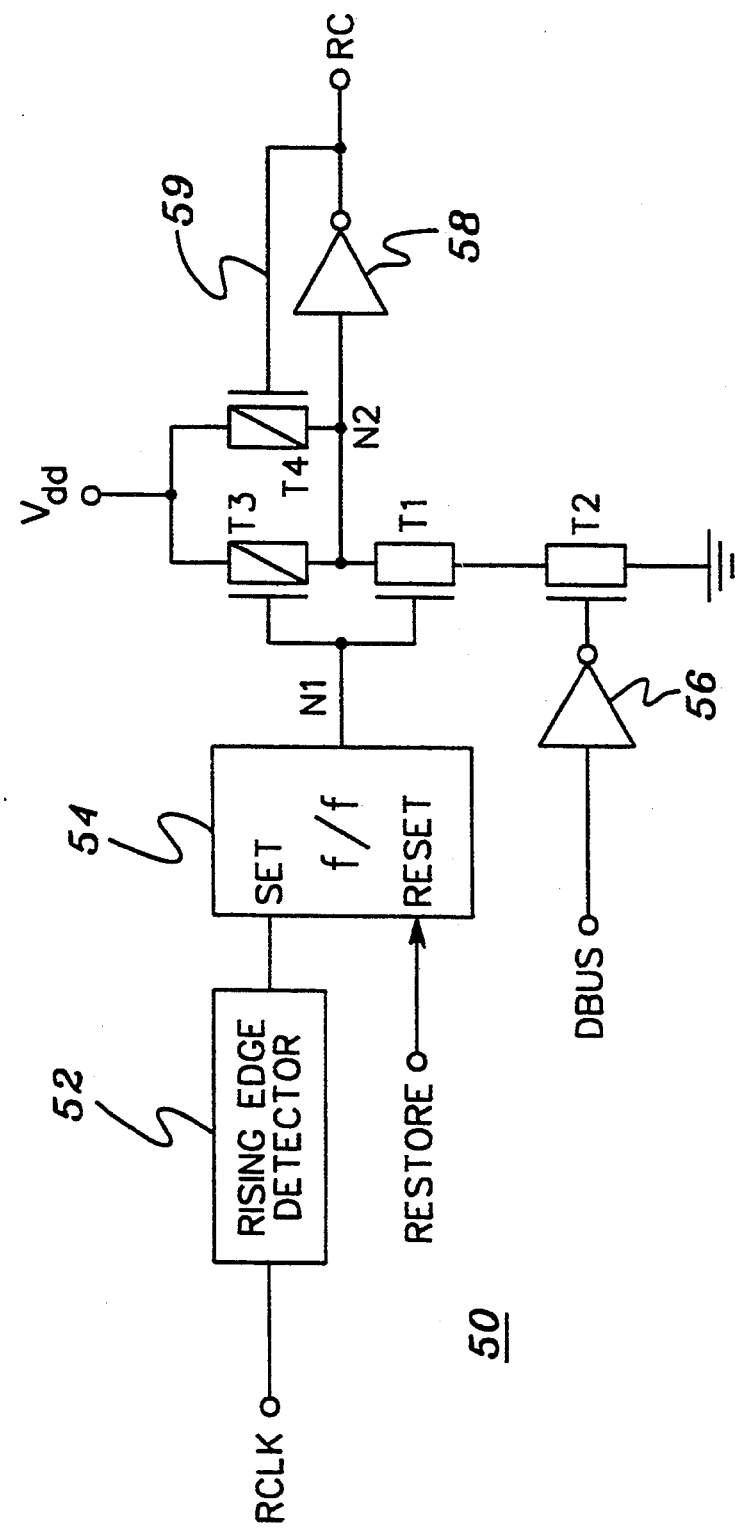
FIG. 6 is a schematic of one embodiment of a control circuit for generating a read command in accordance with the present invention.

FIG. 6 depicts one embodiment of a control circuit 50 for generating the read command (RC) pursuant to the present invention. Control circuit 50 includes a rising edge detector 52 coupled to receive the read clock signal (RCLK). Detector 52 outputs a "set" pulse to the set input of a flip flop latch 54 whenever the read clock signal (RCLK) goes active. Latch 54 provides a high signal at its output node N1 when set. The signal at node N1, referred to herein as a "latch enable signal," gates an NFET T1 and a PFET T3 connected as shown. (In this drawing, P-channel field-effect transistors (PFETs) are indicated by a rectangle with a diagonal line formed therein and a control element or gate electrode arranged adjacent thereto and N-channel field-effect transistors (NFETs) are indicated by a rectangle without a diagonal line and with a control element or gate electrode arranged adjacent thereto.)

A high signal at node N1 turns PFET T3 "off" and NFET T1 "on". NFET T1 is non-conducting, however, until a serially connected NFET T2 is also activated. In the embodiment presented, the dummy bus (DBUS) is assumed to be precharged high (from the precharge cycle) and is switched low by the appropriate dummy cell as an indication that valid data exists (or is about to exist) on the system data bus. This signal is referred to herein as the "valid data signal". Thus, a high state signal on the dummy bus is inverted by an inverter circuit 56 to provide a low state signal to NFET T2 during the precharge cycle and prior to development of valid data on the system data bus. Upon switching to a low state, inverter circuit 56 provides a high control signal at the gate of NFET T2, thereby turning the transistor "on" and allowing current to flow to ground. This forces a low signal at node N2 of circuit 50, which in turn is inverted by an inverter circuit 58 to a high, enabling read command (RC) output. A high read command (RC) is interpreted within the present example as an indication that valid data now exists on the system data bus. As an option, feedback 59 can be provided from the output node of control circuit 50 to the gate of a PFET T4 to assist in driving the circuit output node low when the read command (RC) is discontinued.

From the above discussion, those skilled in the art will note that this invention presents a novel control circuit and control process for a read access cycle within a semiconductor memory system. The control approach precisely generates a read command (RC) substantially simultaneous with development of valid data on the system data bus. By providing a positive indication of valid data development on the system data bus, the read access cycle is shortened, thereby improving system performance. The concepts presented apply to any memory system including RAMs, ROMs, DRAMs, SRAMs, etc. Reduced noise and power losses result from eliminating double switching at the data output latches. The control circuit and control process are independent of the system data bus, with no direct monitoring and feedback from the system data bus required.

Although specific embodiments of the present invention have been illustrated in the accompanying drawings and described in the foregoing detailed description, it will be understood that the invention is not limited to the particular embodiments described herein, but is capable of numerous rearrangements, modifications and substitutions without departing from the scope of the invention. The following claims are intended to encompass all such modifications.

We claim:

1. In a memory system having a system data bus coupled to at least one data output latch, a control circuit for generating a read command to enable the at least one data output latch to latch valid data from the system data bus in response to a read clock signal, said control circuit comprising:

detecting means for detecting the read clock signal and for generating in response thereto a latch enable signal;

signaling means for generating a valid data signal representative of valid data occurring on the system data bus, said valid data signal being generated by said signaling means without direct monitoring of the system data bus; and control means coupled to the detecting means and the signaling means for providing the read command to the at least one data output latch upon occurrence of both the latch enable signal and the valid data signal.

2. The control circuit of claim 1, wherein said detecting means comprises a clock signal edge detector and a flip flop latch, said clock signal edge detector being coupled to receive the read clock signal and provide a set signal upon detection of a transition in the read clock signal, said flip flop latch being coupled to receive said set signal at a set input and output in response thereto the latch enable signal.

3. The control circuit of claim 1, wherein said signaling means includes means for generating a valid data signal simultaneous in time with development of valid data on the system data bus.

4. The control circuit of claim 1, wherein said signaling means includes means for generating a valid data signal at a small predefined time interval prior to the instant of valid data development on the system data bus.

5. The control circuit of claim 1, wherein said signaling means includes a dummy data bus associated with the system data bus, said dummy data bus providing independent of the system data bus the valid data signal representative of valid data occurring on the system data bus.

6. The control circuit of claim 5, wherein the memory system includes a plurality of memory subarrays, each memory subarray having a plurality of words, each word comprising a plurality of memory cells, and wherein said control means further comprises a plurality of dummy cells, each dummy cell being integrated with a different word of the memory subarrays, each dummy cell being coupled to the dummy data bus by a dummy bitline, each dummy cell being structured to provide a predefined data signal to the dummy data bus upon a read access to its associated word, the predefined data signal resulting in said valid data signal on said dummy data bus.

7. The control circuit of claim 1, wherein said control means includes a first transistor switch means coupled to receive at a first transistor control input the latch enable signal and a second transistor switch means coupled to receive at a second transistor control input the valid data signal, said first transistor switch means and said second transistor switch means being serially connected such that both said first transistor switch means and said second transistor switch means must be active for said read command to be provided by the control means.

8. The control circuit of claim 7, wherein said control means further includes an output node and wherein said first transistor switch means and said second transistor switch means are serially connected between said output node and a ground node.

9. The control circuit of claim 8, wherein said first transistor switch means comprises a first NFET and said transistor switch means comprises a second NFET, said first NFET being gated by said latch enable signal and said second NFET being gated said valid data signal.

10. The control circuit of claim 9, wherein the valid data signal comprises a low state signal and wherein said control means further comprises a first inverter circuit coupled between the dummy data bus and the gate of said second NFET.

11. The control circuit of claim 8, further comprising a second inverter circuit coupled between the output node and the first transistor switch means of the serially connected first transistor switch means and second transistor switch means, wherein the read command comprises a high state signal whenever the first transistor switch means and the second transistor switch means are active.

12. The control circuit of claim 8, wherein the read command comprises a high state signal and wherein said control means further includes means for driving the output node to a low state signal in the absence of either the latch enable signal or the valid data signal.

13. The control circuit of claim 1, wherein the memory system comprises a random access memory system.

14. In a memory system having multiple memory subarrays and a system data bus coupled to at least one data output latch, a control circuit for generating a read command to enable the at least one data output latch to latch valid data from the system data bus in response to a read clock signal, said control circuit comprising:

detecting means for detecting the read clock signal and for generating in response thereto a latch enable signal;

a dummy circuit associated with each memory subarray for generating in response to the read clock signal and independent of the system data bus a valid data signal representative of valid data occurring on the system data bus; and control means coupled to the detecting means and the dummy circuit for providing the read command to the at least one data output latch upon occurrence of both the latch enable signal and the valid data signal.

15. The control circuit of claim 14, wherein said memory system includes a plurality of memory subarrays, each memory subarray having a plurality of words, each word comprising a plurality of memory cells, and wherein said dummy circuit of said control circuit comprises a dummy data bus associated with the system data bus, said dummy data bus providing independent of the system data bus the valid data signal representative of valid data occurring on the system data bus, a plurality of dummy cells, each dummy cell being integrated with a different word of the memory subarrays, each dummy cell being coupled to the dummy data bus by a dummy bitline, each dummy cell being structured to provide a predefined data signal to the dummy data bus upon a read access to its associated word, the predefined data signal resulting in said valid data signal on said dummy data bus.

16. The control circuit of claim 15, wherein said control means includes a first transistor switch means coupled to receive at a first transistor control input the latch enable signal and a second transistor switch means coupled to receive at a second transistor control input the valid data signal, said first transistor switch means and said second transistor switch means being serially connected such that both said first transistor switch means and said second transistor switch means must be active for said read command to be provided.

17. The control circuit of claim 16, wherein said control means further includes an output node and wherein said first transistor switch means and said second transistor switch means are serially connected between said output node and a ground node.

18. The control circuit of claim 17, wherein said first transistor switch means comprises a first NFET and said second transistor switch means comprises a second NFET, said first NFET being gated by said latch enable signal and said second NFET being gated by said valid data signal.

19. The control circuit of claim 18, wherein the valid data signal comprises a low state signal and wherein said control means further comprises a first inverter circuit coupled between the dummy data bus and a gate of the second NFET.

20. The control circuit of claim 17, further comprising a second invertor circuit coupled between the output node and the first transistor switch means, wherein the read command comprises a high state signal whenever the first transistor switch means and the second transistor switch means are active.

21. The control circuit of claim 14, wherein said dummy circuit includes means for generating the valid data signal simultaneous in time with development of valid data on the system data bus.

22. The control circuit of claim 14, wherein said dummy circuit includes means for generating the valid data signal at a small predefined time interval prior to the instant of valid data signal development on the system data bus.

23. In a memory system having a common system data bus coupled to at least one data output latch, a method for generating a read command to enable the at least one data output latch to latch valid data from the system data bus in response to a read clock signal, said method comprising the steps of:

(a) detecting the read clock signal and generating in response thereto a latch enable signal;

(b) generating without monitoring the system data bus a valid data signal representative of valid data occurring on the system data bus; and (c) providing the read command to the at least one data output latch upon occurrence of both the latch enable signal and the valid data signal.

24. The method of claim 23, wherein said generating step (b) includes generating the valid data signal simultaneous in time with development of valid data on the system data bus.

25. The method of claim 23, wherein said generating step (b) includes generating the valid data signal at a small predefined time interval prior to the instant of valid data development on the system data bus.

26. A semiconductor memory system comprising:

a plurality of memory subarrays, each memory subarray having a plurality of words;

a system data bus common to said plurality of memory subarrays; and a control means coupled to the system data bus and having at least one data output latch, said at least one data output latch being connected to latch valid data from the system data bus in response to a read clock signal upon generation of a read command by the control means, said control means further comprising:

(i) detecting means for detecting the read clock signal and for generating in response thereto a latch enable signal, (ii) signaling means for generating a valid data signal representative of valid data occurring on the system data bus, said valid data signal being generated by said signaling means without direct monitoring of the system data bus, and (iii) control means coupled to the detecting means and the signaling means for providing the read command to the at least one data output latch upon occurrence of both the latch enable signal and the valid data signal.

* * * * *